US009955258B2

United States Patent
Chan

(10) Patent No.: US 9,955,258 B2
(45) Date of Patent: Apr. 24, 2018

(54) WIRELESS MUSIC OPTIMIZING APPARATUS

(71) Applicant: Cheng-Yang Chan, Taichung (TW)

(72) Inventor: Cheng-Yang Chan, Taichung (TW)

( * ) Notice: Subject to any disclaimer, the term of this patent is extended or adjusted under 35 U.S.C. 154(b) by 364 days.

(21) Appl. No.: 14/973,664

(22) Filed: Dec. 17, 2015

(65) Prior Publication Data

US 2017/0180854 A1    Jun. 22, 2017

(51) Int. Cl.
*H04R 3/04* (2006.01)
*H03G 5/16* (2006.01)

(52) U.S. Cl.
CPC .............. *H04R 3/04* (2013.01); *H03G 5/165* (2013.01); *H04R 2420/07* (2013.01); *H04R 2499/13* (2013.01)

(58) Field of Classification Search
USPC .......................................................... 381/79
See application file for complete search history.

(56) References Cited

U.S. PATENT DOCUMENTS

| 9,560,431 B1* | 1/2017 | Lilly | H04R 1/028 |
| 2007/0015485 A1* | 1/2007 | DeBiasio | H04B 1/082 455/345 |
| 2007/0111700 A1* | 5/2007 | Chen | H04B 1/034 455/345 |
| 2008/0032650 A1* | 2/2008 | Zhang | H04M 1/6091 455/185.1 |
| 2013/0089026 A1* | 4/2013 | Piper | H04W 4/00 370/328 |
| 2016/0041808 A1* | 2/2016 | Pelland | G06F 3/162 381/123 |
| 2017/0262252 A1* | 9/2017 | Pelland | G06F 3/162 |

* cited by examiner

*Primary Examiner* — Jason C Olson
(74) *Attorney, Agent, or Firm* — Rosenberg, Klein & Lee

(57) ABSTRACT

The present invention relates to a wireless device which is used for receiving and optimizing external music, and has two different embodiments, which mainly comprises a base and an optimizing module, wherein the optimizing module electrically connected to the base. In the first embodiment, the optimizing module further has a receiving unit for receiving external music. In the second embodiment, the receiving unit is built inside the base. External music transmit from an electronic device to the receiving unit and optimized by the optimizing module for hearing optimized music.

12 Claims, 5 Drawing Sheets

WIRELESS MUSIC OPTIMIZING APPARATUS

BACKGROUND OF THE INVENTION

1. Field of the Invention

The present invention relates to a music optimizing apparatus. More particularly, the present invention relates to a wireless music optimizing apparatus.

2. Description of Related Art

For early, most of music is stored in cassette or CD, and the car audio equipment accepts cassette or CD only. The cassette and CD often played or stored for a long time were easy to damage. With advanced technology nowadays, music cassette tapes have been replaced by digital music such as mp3 file format. The digital music is usually stored in electronic devices, such as mobile phones, tablets, or computers, and no longer connects to the traditional car audio equipment which accepts cassette or CD only. In addition, several times of converting, burning, or reading the music signal stored in cassette or CD process, might cause the music quality changes that affect the sounds or cause music distortion.

The car audio equipment on market today is further applied to the wireless transmission mode and electronic devices connection, thus, drivers and passengers may transmit music using mobile phone or tablet PC. However, the music play on car audio equipment might be distorted after wireless transmission.

Some people want to hear different type of sounds who may use the equalizer installed in the computer. The equalizer software in computer for playing music can adjust the audio frequency of music. The user manually tune the music by the equalizer software for hearing different sounds as different type of equalizer mode such as classic, jazz, or rock which is not quiet convenient.

SUMMARY OF THE INVENTION

The inventions described herein provide a wireless music optimizing apparatus. The wireless music optimizing apparatus for receiving external music and optimization comprises a base provided with a first connecting interface on one end thereof, a first bus arranged on the first connecting interface, a transmission member and an audio cable disposed at the other end of the base, and a receiving unit disposed inside the base, wherein the transmission member, the audio cable, and the receiving unit electrically connected with the first bus, the transmission member electrically connected to an external power system and receiving unit received the external music signals; and an optimizing module having a second connecting interface connected to the first connecting interface for locating the optimizing module at the base, a second bus arranged on the second connecting interface and electrically connected to the first bus, wherein external music signals are transmitted from the receiving unit through the optimizing module to the audio cable. In this aspect of present invention, the receiving unit is built in the base.

Another aspect of the present invention, the wireless music optimizing apparatus with the receiving unit is built in the optimizing processor. The wireless music optimizing apparatus comprises a base provided with a first connecting interface on one end thereof, a first bus arranged on the first connecting interface, a transmission member and an audio cable disposed at the other end of the base, wherein the transmission member and the audio cable electrically connected with the first bus, the transmission member electrically connected to an external power system and receiving unit received the external music signals; and an optimizing module having a second connecting interface connected to the first connecting interface for locating the optimizing module at the base, a second bus arranged on the second connecting interface and electrically connected to the first bus, a receiving unit disposed inside the base and electrically connected with the first bus, wherein external music signals are transmitted from the receiving unit through the optimizing module to the audio cable.

The wireless music optimizing apparatus receive and optimize external music, and output to the external audio equipment for beautiful sounds. According to another aspect of the invention, providing an alternatively optimizing module of wireless music optimizing apparatus for receiving external music and optimization, each optimizing processor has one type of equalizer mode built inside. The user could choose different optimizing module to connect the base for choosing different type of equalizer mode to enjoy external music.

DETAILED DESCRIPTION OF THE INVENTION

To describe clearly that the present invention achieves the foregoing objective and function, the technical features and desired function are described with reference to a preferred embodiment and accompanying drawings.

Figure 1:
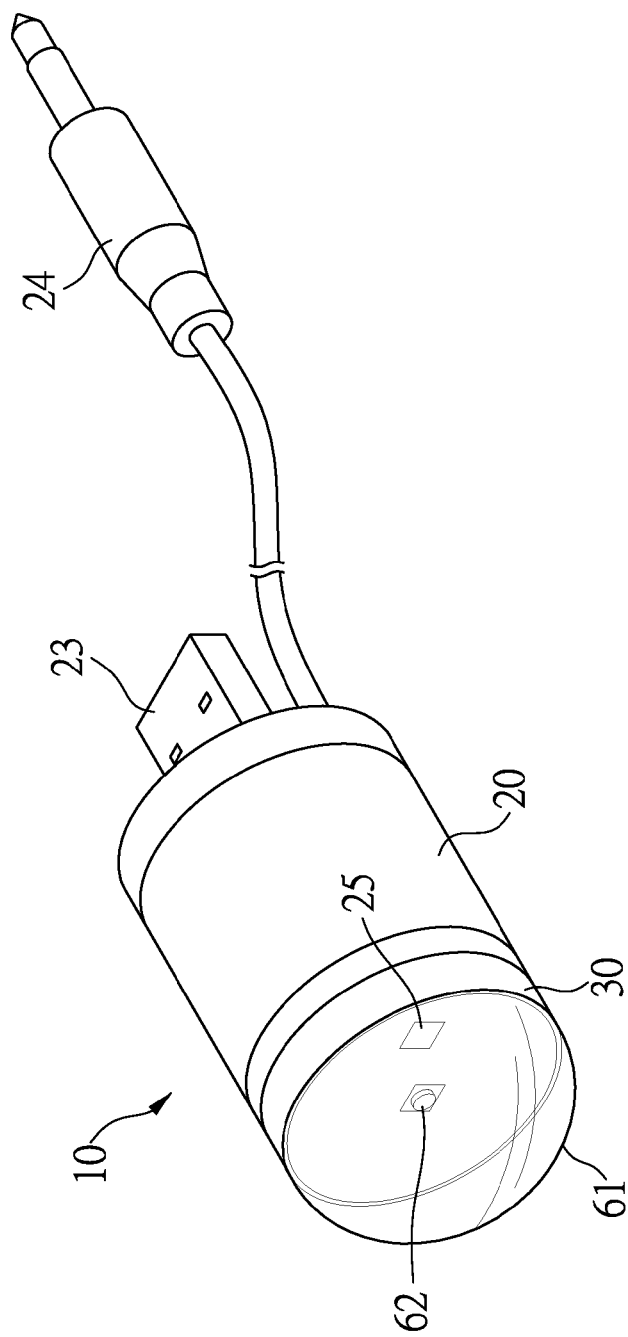
FIG. 1 is a three-dimensional view of a preferred embodiment of the present invention.
Figure 2:
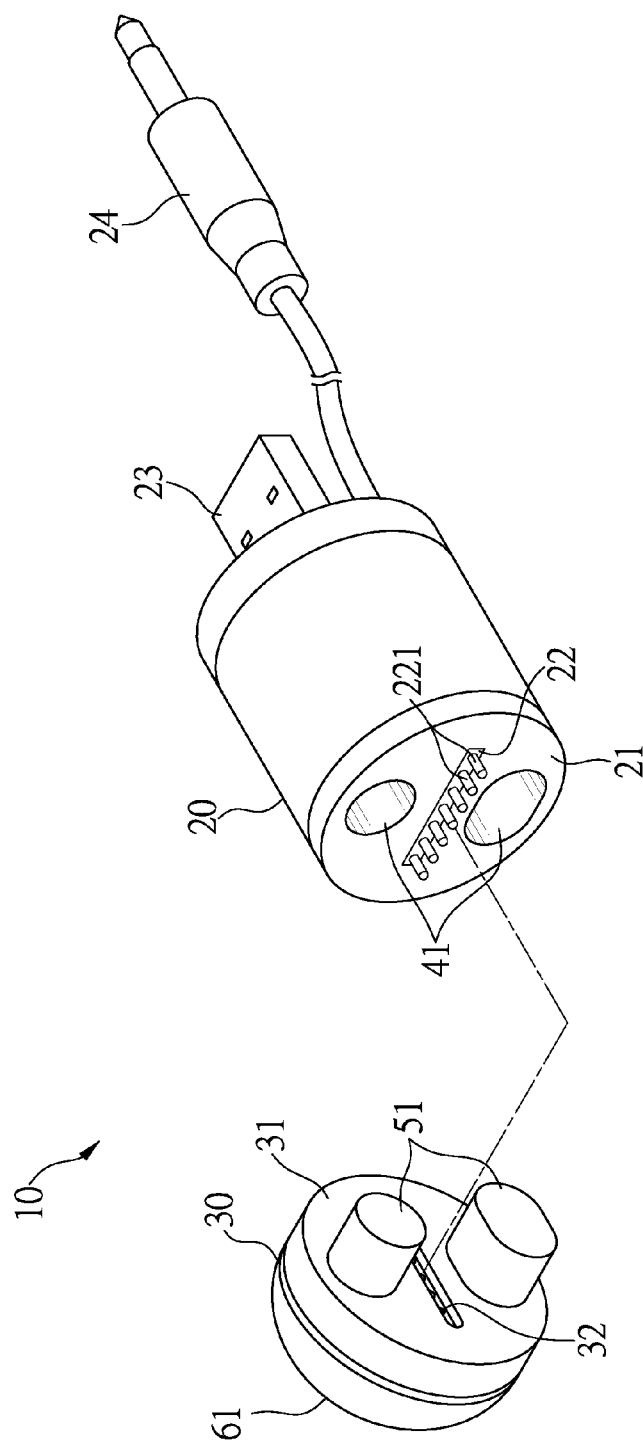
FIG. 2 is an exploded view of a preferred embodiment of the present invention.

Please refer to FIG. 1 and FIG. 2, one preferred embodiment of the wireless music optimizing apparatus 10 includes a base 20 provided with a first connecting interface 21 on one end thereof, a first bus 22 arranged on the first connecting interface 21, a transmission member 23 and an audio cable 24 disposed at the other end of the base 20, and a receiving unit 25 disposed inside the base 20, wherein the transmission member 23, the audio cable 24, and the receiving unit 25 electrically connected with the first bus 22, the transmission member 23 electrically connected to an external power system and receiving unit 25 received the external music signals; and an optimizing module 30 having a second connecting interface 31 connected to the first connecting interface 21 for locating the optimizing module 30 at the base 20, a second bus 32 arranged on the second connecting interface 31 and electrically connected to the first bus 22, wherein external music signals are transmitted from the receiving unit 25 through the optimizing module 30 to the audio cable 24.

The optimizing module 30 connect with the base 20 by the first and second connecting interface 21,31. More particularly, a first attractive object 41 arranged on the first connecting interface 21, and a second attractive object 51 arranged on the second connecting interface 31 corresponding to the first attractive object 41, the first attractive object 41 and the second attractive object 51 are magnetic attracted each other. The first and second connecting interface 21,31 attract each other by magnetic force; furthermore, a first attractive object 41 includes a bigger concave and a smaller concave, a second attractive object 51 includes a bigger convex and a smaller convex corresponding to the concaves of the first attractive object 41. The convexes and concaves can be interchanged as long as the first and second connecting interface 21,31 matched with each other.

In addition, the first bus 22 comprises a plurality of pins 221, and the second bus 32 comprises a plurality of dots or holes corresponding to the pins 221. Using the convexes of the second connecting interface 31 engaged in the concaves of the first connecting interface 21, the first bus 22 and the second bus 32 are connected precisely to prevent signal loss.

Figure 3:
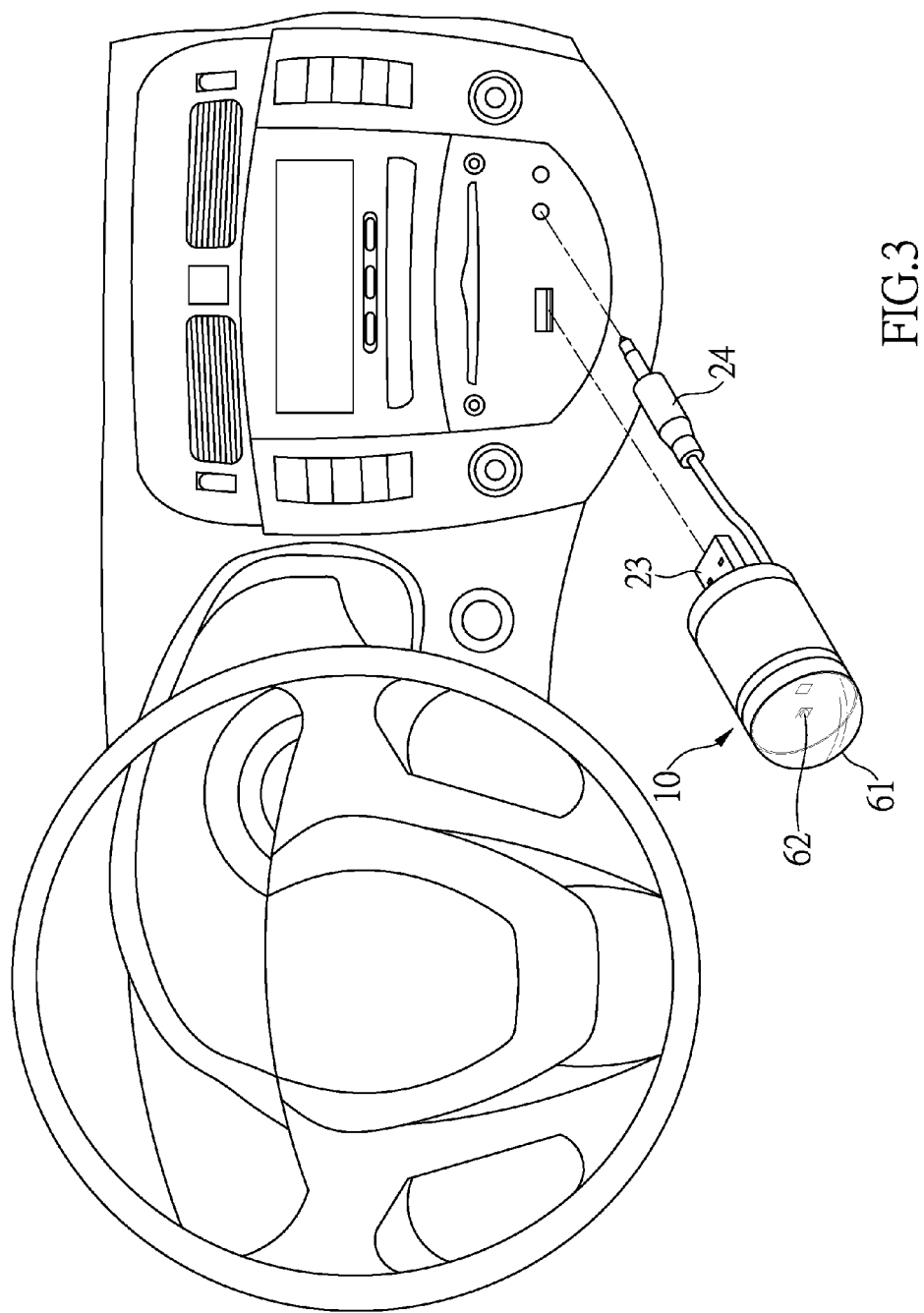
FIG. 3 is a schematic implementation view of a preferred embodiment of the present invention.
Figure 4:
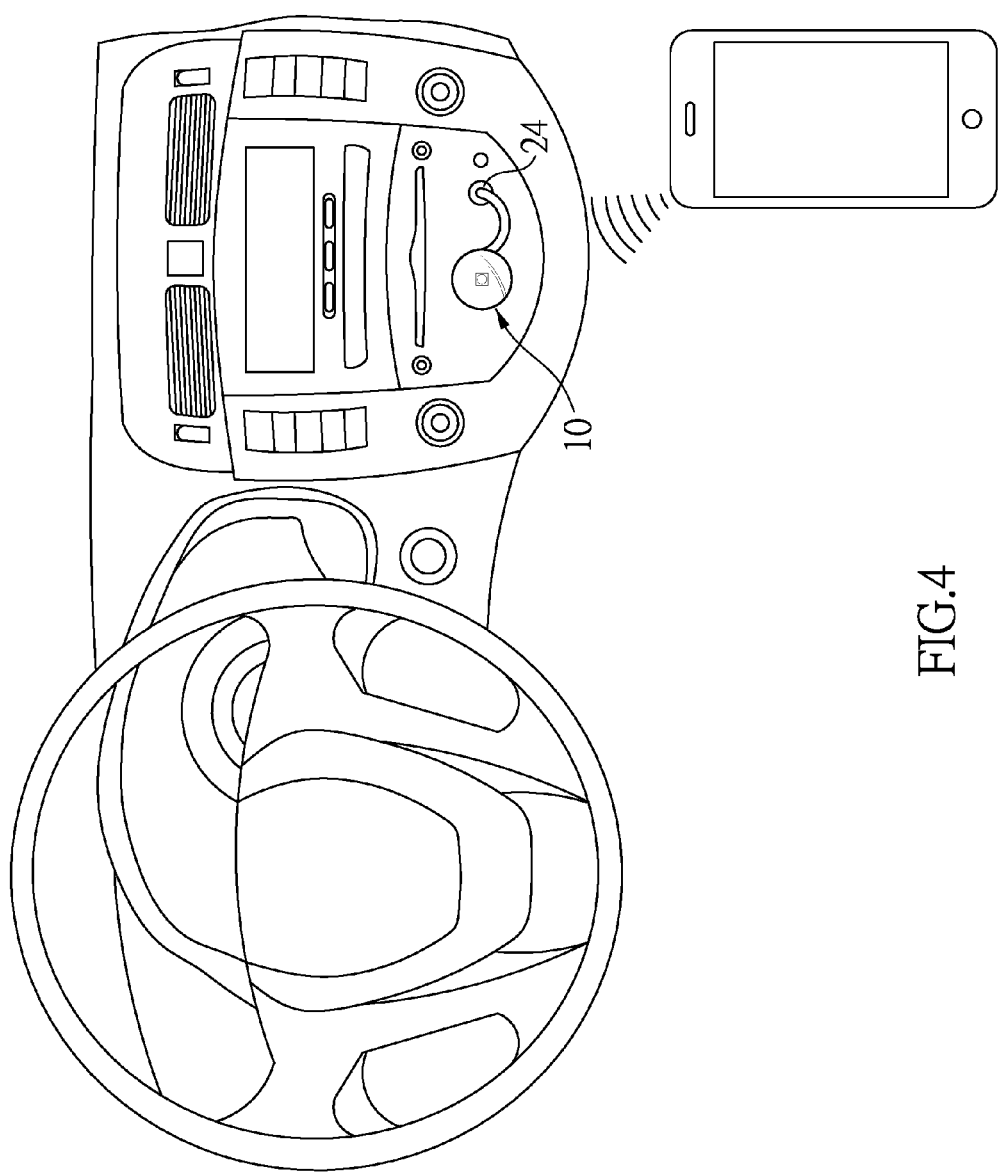
FIG. 4 is a schematic implementation view of a preferred embodiment of the present invention.

As FIG. 3 and FIG. 4 show, the user plugin the transmission member 23 into the USB port of car audio equipment for providing electricity, and plugin the audio cable 24 into the AUX port for transmission optimized music to the car audio equipment. The translucent cover 61 lights from the LED 62 which disposed in the optimizing module 30 when connecting success. The light of translucent slowly light and dark to indicate the present invention is operating, and the frequency of the light from light to dark corresponding to one type of equalizer mode built inside the optimizing module 30.

The receiving unit 25 receive music signal from the electronic device could by at least one way. The receiving unit 25 comprises at least one type unit such as Bluetooth wireless receiving unit, a cloud wireless receiving unit, an infrared receiving unit, a Wi-Fi wireless receiving unit, or a RFID receiving unit. Therefore, the user can choose different type of communication protocol (transmission mode) for transmitting music from the electronic device to the present invention.

Figure 5:
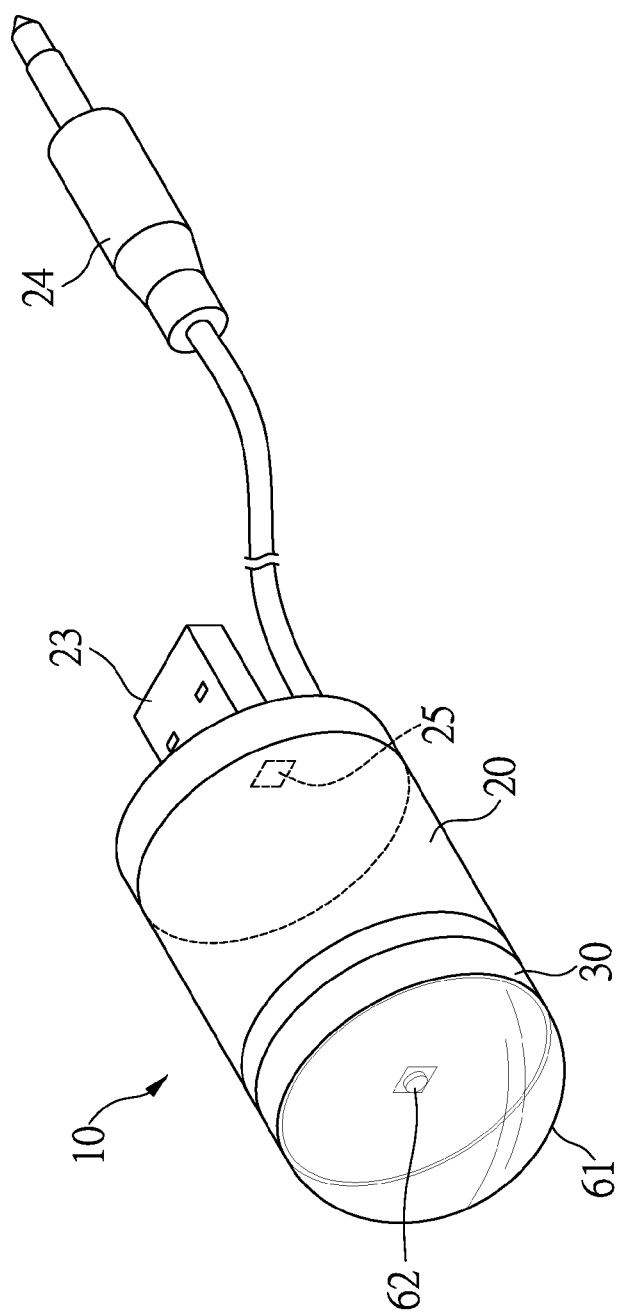
FIG. 5 is a three-dimensional view of another preferred embodiment of the present invention.

Please refer to FIG. 1 and FIG. 5, the receiving unit 25 of present invention might be built in the base 20 or the optimizing module 30 to receive external music from electronic device such as mobile phone, tablet PC, or laptop computer. The external music is transmitted from the electronic device, received by receiving unit 25, optimized through the optimizing module 30, transmitted to the audio cable 24, and output to the audio input interface of car audio equipment such as AUX in port.

In another embodiment of present invention provides a base 20 provided with a first connecting interface 21 on one end thereof, a first bus 22 arranged on the first connecting interface 21, a transmission member 23 and an audio cable 24 disposed at the other end of the base 20, wherein the transmission member 23 and the audio cable 24 electrically connected with the first bus 22, the transmission member 23 electrically connected to an external power system and receiving unit 25 received the external music signals, and an optimizing module 30 having a second connecting interface 31 connected to the first connecting interface 21 for locating the optimizing module 30 at the base 20, a second bus 32 arranged on the second connecting interface 31 and electrically connected to the first bus 22, a receiving unit 25 disposed inside the base 20 and electrically connected with the first bus 22; wherein external music signals are transmitted from the receiving unit 25 through the optimizing module 30 to the audio cable 24. In this embodiment of present invention, the receiving unit 25 is built in the base 20.

An equalizer built inside the optimizing module 30 or the base 20, which is set one type of equalizer mode such as classic, rock, jazz. There are a lot of optimizing modules 30 could be choose to join with the base 20 for hearing different sounds. The user may choose the classic type of optimizing module 30 for relaxing, or may choose the rock type of optimizing module 30 for exiting. Therefore, the users no need to manually adjust the equalizer software in the mobile phone or the tablets, and the music transmitted through the optimizing unit prevents the music distortion.

The foregoing descriptions are merely the exemplified embodiments of the present invention, where the scope of the claim of the present invention is not intended to be limited by the embodiments. Any equivalent embodiments or modifications without departing from the spirit and scope of the present invention are therefore intended to be embraced.

The disclosed structure of the invention has not appeared in the prior art and features efficacy better than the prior structure which is construed to be a novel and creative invention, thereby filing the present application herein subject to the patent law.

What is claimed is:

1. A wireless music optimizing apparatus for receiving external music and optimization, comprising:
a base provided with a first connecting interface on one end thereof, a first bus arranged on the first connecting interface, a transmission member, including a USB interface, and an audio cable disposed at the other end of the base, and a receiving unit disposed inside the base, wherein the transmission member, the audio cable, and the receiving unit electrically connected with the first bus, the transmission member electrically connected to an external power system and receiving unit received the external music signals; and
an optimizing module, including an equalizer, having a second connecting interface connected to the first connecting interface for locating the optimizing module at the base, a second bus arranged on the second connecting interface and electrically connected to the first bus;
wherein external music signals are transmitted from the receiving unit through the optimizing module to the audio cable.

2. The wireless music optimizing apparatus as claimed in claim 1, wherein the base further comprises a first attractive object arranged on the first connecting interface, and the optimizing module further comprises a second attractive object arranged on the second connecting interface corresponding to the first attractive object, the first attractive object and the second attractive object are magnetic attracted each other.

3. The wireless music optimizing apparatus as claimed in claim 2, wherein the first attractive object are two different size of convex/concave portions, and the second attractive object are two different size of concave/convex portions corresponding to the first attractive object.

4. The wireless music optimizing apparatus as claimed in claim 1, wherein the optimizing module further comprising: a translucent cover disposed on the opposite of the second attractive object, a LED disposed within the translucent cover.

5. The wireless music optimizing apparatus as claimed in claim 1, wherein the receiving unit is a Bluetooth wireless receiving unit, a cloud wireless receiving unit, an infrared receiving unit, a Wi-Fi wireless receiving unit, or a RFID receiving unit.

6. The wireless music optimizing apparatus as claimed in claim 1, wherein the first bus comprises a plurality of pins, and the second bus comprises a plurality of dots or holes corresponding to the pins.

7. A wireless music optimizing apparatus for receiving external music and optimization, comprising:
a base provided with a first connecting interface on one end thereof, a first bus arranged on the first connecting interface, a transmission member, including a USB interface, and an audio cable disposed at the other end of the base, wherein the transmission member and the audio cable electrically connected with the first bus, the transmission member electrically connected to an external power system and receiving unit received the external music signals; and
an optimizing module, including an equalizer, having a second connecting interface connected to the first connecting interface for locating the optimizing module at the base, a second bus arranged on the second connecting interface and electrically connected to the first bus, a receiving unit disposed inside the base and electrically connected with the first bus;
wherein external music signals are transmitted from the receiving unit through the optimizing module to the audio cable.

8. The wireless music optimizing apparatus as claimed in claim 7, wherein the base further comprises a first attractive object arranged on the first connecting interface, and the optimizing module further comprises a second attractive object arranged on the second connecting interface corresponding to the first attractive object, the first attractive object and the second attractive object are magnetic attracted each other.

9. The wireless music optimizing apparatus as claimed in claim 8, wherein the first attractive object are two different size of convex/concave portions, and the second attractive object are two different size of concave/convex portions corresponding to the first attractive object.

10. The wireless music optimizing apparatus as claimed in claim 7, wherein the optimizing module further comprising: a translucent cover disposed on the opposite of the second attractive object, a LED disposed within the translucent cover.

11. The wireless music optimizing apparatus as claimed in claim 7, wherein the receiving unit is a Bluetooth wireless receiving unit, a cloud wireless receiving unit, an infrared receiving unit, a Wi-Fi wireless receiving unit, or a RFID receiving unit.

12. The wireless music optimizing apparatus as claimed in claim 7, wherein the second bus comprises a plurality of pins, and the first bus comprises a plurality of dots or holes corresponding to the pins.

* * * * *